US010865311B2

(12) United States Patent
Kobayashi et al.

(10) Patent No.: US 10,865,311 B2
(45) Date of Patent: Dec. 15, 2020

(54) COATING LIQUID FOR FORMING PIEZOELECTRIC THIN FILM, METHOD OF PRODUCING COATING LIQUID FOR FORMING PIEZOELECTRIC THIN FILM, PIEZOELECTRIC THIN FILM, METHOD OF MANUFACTURING PIEZOELECTRIC THIN FILM, AND LIQUID EJECTION HEAD

(71) Applicants: CANON KABUSHIKI KAISHA, Tokyo (JP); FUJI CHEMICAL CO., LTD., Osaka (JP)

(72) Inventors: Motokazu Kobayashi, Yokohama (JP); Minako Nakasu, Tokyo (JP); Naoyuki Koketsu, Komae (JP); Chiemi Shimizu, Hirakata (JP); Fumio Uchida, Daito (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 189 days.

(21) Appl. No.: 15/493,426

(22) Filed: Apr. 21, 2017

(65) Prior Publication Data

US 2017/0335111 A1 Nov. 23, 2017

(30) Foreign Application Priority Data

May 18, 2016 (JP) .................. 2016-099735

(51) Int. Cl.
*C09D 1/00* (2006.01)
*C23C 18/12* (2006.01)
(Continued)

(52) U.S. Cl.
CPC .............. *C09D 1/00* (2013.01); *B41J 2/161* (2013.01); *B41J 2/164* (2013.01);
(Continued)

(58) Field of Classification Search
None
See application file for complete search history.

(56) References Cited

U.S. PATENT DOCUMENTS 6,097,133 A 8/2000 Shimada et al.
6,294,860 B1 9/2001 Shimada et al.
(Continued)

FOREIGN PATENT DOCUMENTS

JP 2001-172099 A 6/2001
JP 2005-272294 A 10/2005
(Continued)

OTHER PUBLICATIONS

Shindo JP 2001-172099, Machine Translation obtained from J-PlatPat (Year: 2001).*
(Continued)

*Primary Examiner* — Colin W. Slifka
(74) *Attorney, Agent, or Firm* — Venable LLP (57) ABSTRACT

Provided is a coating liquid for forming a piezoelectric thin film containing lead zirconate titanate, the coating liquid including a complex precursor containing at least three kinds of metal elements of Pb, Ti, and Zr, the coating liquid being free from an exothermic peak at a temperature of 450° C. or more, or having a heat generation amount at a temperature of from 400° C. to 450° C., which is larger than a heat generation amount at a temperature of from 450° C. to 500° C., in differential thermal analysis of the coating liquid.

6 Claims, 2 Drawing Sheets (51) Int. Cl.
  *B41J 2/16* (2006.01)
  *H01L 41/08* (2006.01)
  *H01L 41/187* (2006.01)
  *H01L 41/318* (2013.01)
  *H01L 41/09* (2006.01)

(52) U.S. Cl.
  CPC ...... *C23C 18/1216* (2013.01); *C23C 18/1241* (2013.01); *C23C 18/1283* (2013.01); *C23C 18/1291* (2013.01); *H01L 41/0805* (2013.01); *H01L 41/1876* (2013.01); *H01L 41/318* (2013.01); *B41J 2202/03* (2013.01); *H01L 41/0973* (2013.01)

(56) References Cited

U.S. PATENT DOCUMENTS

| | | |
|---|---|---|
| 6,387,225 B1 | 5/2002 | Shimada et al. |
| 7,399,067 B2 | 7/2008 | Kubota et al. |
| 8,227,021 B2 | 7/2012 | Kubota et al. |
| 8,715,823 B2 | 5/2014 | Kubota et al. |
| 9,437,806 B2 | 9/2016 | Kobayashi et al. |
| 10,099,476 B2 | 10/2018 | Kobayashi et al. |
| 2004/0129918 A1* | 7/2004 | Eritate ............ B41J 2/161 252/62.9 R |
| 2016/0339702 A1 | 11/2016 | Kobayashi et al. |

FOREIGN PATENT DOCUMENTS

| | | |
|---|---|---|
| JP | 3890634 B2 | 3/2007 |
| JP | 2008-238485 A | 10/2008 |
| JP | 2015-130491 A | 7/2015 |

OTHER PUBLICATIONS

Notification of Reasons for Refusal in Japanese Application No. 2017-094613 (dated Sep. 17, 2019).

* cited by examiner

COATING LIQUID FOR FORMING PIEZOELECTRIC THIN FILM, METHOD OF PRODUCING COATING LIQUID FOR FORMING PIEZOELECTRIC THIN FILM, PIEZOELECTRIC THIN FILM, METHOD OF MANUFACTURING PIEZOELECTRIC THIN FILM, AND LIQUID EJECTION HEAD

BACKGROUND OF THE INVENTION

Field of the Invention

The present invention relates to a coating liquid for forming a piezoelectric thin film, a method of producing the coating liquid for forming a piezoelectric thin film, a piezoelectric thin film obtained by forming the coating liquid into a film and sintering the film, a method of manufacturing the piezoelectric thin film, and a liquid ejection head using the piezoelectric thin film.

Description of the Related Art

In general, a piezoelectric thin film contains lead zirconate titanate (hereinafter sometimes referred to as "PZT"). As an application example of a piezoelectric element using the piezoelectric thin film, there is given a liquid ejection head configured to eject a liquid such as ink. In order for the piezoelectric thin film used in this application to exhibit a sufficient electromechanical transduction function (pressure for accelerating displacement), the piezoelectric thin film needs to have a thickness of from about 1 μm to about 25 μm. Regarding the orientation of a crystal of the piezoelectric thin film containing PZT or the like, the following has been known. As the ratio of a (100) orientation becomes higher than those of other orientations, for example, a (111) orientation and a (110) orientation, the direction of a polarization moment significantly approaches the deformation direction of a piezoelectric body. As a result, the deformation amount increases, and the piezoelectric element using the piezoelectric thin film may be suitably used as an actuator of a liquid ejection head or the like.

As a method of manufacturing the piezoelectric thin film, there are given a sputtering method, a metal organic chemical vapor deposition (MOCVD) method, a sol-gel method, and the like. The sol-gel method involves applying a solution or a dispersion liquid containing a hydrolysable compound of each component metal serving as a raw material, a partial hydrolysate thereof, or a partial polycondensate thereof onto a substrate, drying the coating film, heating the coating film in air to form a film that is to serve as the piezoelectric thin film, and further sintering the film at a temperature equal to or more than a crystallization temperature of the piezoelectric thin film to crystallize the film, to thereby form the piezoelectric thin film.

As the hydrolysable metal compound serving as a raw material, an organic metal compound such as a metal alkoxide, a partial hydrolysate thereof, or a partial polycondensate thereof is generally used. The sol-gel method is capable of forming the piezoelectric thin film most simply at lowest cost.

As a method similar to the sol-gel method, there is given a metal organic decomposition (MOD) method. The MOD method involves applying a solution containing a thermally-decomposable organic metal compound (metal complex or metal organic acid salt), for example, a β-diketone complex or a carboxylate of a metal onto a substrate, heating the solution in, for example, air or oxygen to cause evaporation of the solvent in the coating film and pyrolysis of the organic metal compound, to thereby form a film that is to serve as the piezoelectric thin film, and further sintering the film at a temperature equal to or more than a crystallization temperature of the piezoelectric thin film to crystallize the film. In the present invention, the sol-gel method, the MOD method, and a combination of those methods are collectively referred to as "sol-gel method".

In order to achieve a (100) orientation degree of 30% or more in a PZT thin film obtained by the sol-gel method, it has been proposed that a third component such as lead magnesium niobate be added to lead zirconate titanate (Japanese Patent No. 3890634).

When a general metal complex or organic acid metal salt is merely used by being dissolved in a solvent as a composition for forming the piezoelectric thin film in the sol-gel method, the organic metal compounds have different hydrolysis rates, and hence each organic metal compound generates an independent metal oxide in the piezoelectric thin film, with the result that the piezoelectric thin film is difficult to have a uniform composition.

In view of the foregoing, the metal complex and the organic metal compound are caused to react with each other before being hydrolyzed to form a complex organic metal compound (organic metal compound containing two or more metals), to thereby provide a uniform composition. As a specific method for complexing, there may be given a polymerization reaction through heating and a complex reaction using a complexing agent.

Those complexing mechanisms are complicated, and hence it has not been clarified what kind of molecular structure is obtained except for that of a simple system such as silica. However, the molecular structure influences the orientation of a film product, and hence the ratio of a (100) orientation varies depending on the manufacturing method, with the result that variations in electrical characteristics occur.

SUMMARY OF THE INVENTION

In view of the above-mentioned problems, the present invention is directed to providing a coating liquid for forming a piezoelectric thin film for forming a piezoelectric thin film having a high ratio of a (100) orientation and having satisfactory reproducibility, a piezoelectric thin film obtained from the coating liquid, a method of producing the coating liquid for forming a piezoelectric film, a method of manufacturing the piezoelectric thin film, and a liquid ejection head.

According to an aspect of the present invention, there is provided a coating liquid for forming a piezoelectric thin film containing lead zirconate titanate, the coating liquid including a complex precursor containing at least three kinds of metal elements of Pb, Ti, and Zr, the coating liquid being free from an exothermic peak at a temperature of 450° C. or more in differential thermal analysis (DTA) of the coating liquid.

According to another aspect of the present invention, there is provided a coating liquid for forming a piezoelectric thin film containing lead zirconate titanate, the coating liquid including a complex precursor containing at least three kinds of metal elements of Pb, Ti, and Zr, the coating liquid having a heat generation amount at a temperature of from 400° C. to 450° C., which is larger than a heat generation amount at a temperature of from 450° C. to 500° C., in differential thermal analysis of the coating liquid.

According to still another aspect of the present invention, there is provided a method of producing the above-mentioned coating liquid for forming a piezoelectric thin film, including: heating at least three kinds of raw material compounds containing each of metal elements of Pb, Ti, and Zr or at least two kinds of raw material compounds including a complex raw material compound containing any two kinds of the metal elements and a raw material compound containing the remaining metal element at a temperature of 120° C. or more in an organic solvent, to thereby form a complex precursor containing at least three kinds of the metal elements of Pb, Ti, and Zr; and hydrolyzing the complex precursor by adding water to a system after the heating.

According to yet another aspect of the present invention, there is provided a piezoelectric thin film formed of a sintered product of the above-mentioned coating liquid for forming a piezoelectric thin film, the piezoelectric thin film including lead zirconate titanate represented by $Pb_x(Zr_{(y)}Ti_{(1-y)})O_3$, where $x=1.0$ to $1.2$ and $0.4<y<0.6$, the piezoelectric thin film having a ratio of reflection intensity of a (100) plane with respect to total reflection intensity of the (100) plane, a (110) plane, and a (111) plane of 95% or more, which is measured by an X-ray diffraction method.

According to still a further aspect of the present invention, there is provided a liquid ejection head, including: an ink ejection orifice; a pressure chamber communicating with the ink ejection orifice; and an actuator configured to cause, in the pressure chamber, a capacity change for ejecting ink from the ink ejection orifice, in which the actuator includes a vibrating plate including a first surface facing the pressure chamber, a lower electrode on a second surface of the vibrating plate, which is opposed to the first surface of the vibrating plate, the above-mentioned piezoelectric thin film on the lower electrode, and an upper electrode on the piezoelectric thin film.

Further features of the present invention will become apparent from the following description of exemplary embodiments with reference to the attached drawings.

DESCRIPTION OF THE EMBODIMENTS

Now, an embodiment of the present invention is described.

A coating liquid for forming a piezoelectric thin film (hereinafter simply referred to as "coating liquid") of the present invention includes a complex precursor containing at least three kinds of metal elements of Pb, Ti, and Zr and has no exothermic peak at a temperature of 450° C. or more in differential thermal analysis of the coating liquid. Further, the coating liquid of the present invention includes the complex precursor and has a heat generation amount at a temperature of from 400° C. to 450° C., which is larger than a heat generation amount at a temperature of from 450° C. to 500° C., in differential thermal analysis of the coating liquid. In particular, in the present invention, it is only necessary that the coating liquid have an exothermic peak at a temperature of from 400° C. to 450° C. without having an exothermic peak at a temperature of from 450° C. to 500° C. Alternatively, even when the coating liquid has an exothermic peak at a temperature of from 450° C. to 500° C., it is only necessary that the electromotive force of the exothermic peak at a temperature of from 400° C. to 450° C. be higher than that at a temperature of from 450° C. to 500° C. The exothermic peak appears in the process of oxidation of the complex precursor.

The exothermic peak present at a temperature of 450° C. or more suggests that an organic substance remains in a temperature range of crystallization, and it is presumed that the organic substance binds to a (100) plane growing into a crystal to inhibit the crystal growth of the (100) plane, to thereby make it difficult to control an orientation. Meanwhile, when there is no exothermic peak at a temperature of 450° C. or more, the following is considered. The organic substance is substantially eliminated, and there are few substances that inhibit the crystal growth. Therefore, due to the influence of an underlying crystal plane, a piezoelectric thin film having an extremely high ratio of a (100) orientation as compared to those of a (111) orientation and a (110) orientation can be obtained.

Such coating liquid is produced at least through a heating step of heating at least three kinds of raw material compounds containing each of metal elements of Pb, Ti, and Zr or at least two kinds of raw material compounds including a complex raw material compound containing any two kinds of the metal elements and a raw material compound containing the remaining metal element at a temperature of 120° C. or more in an organic solvent, to thereby form a complex metal compound containing at least three kinds of the metal elements of Pb, Ti, and Zr, and a hydrolyzing step of hydrolyzing the complex metal compound by adding water to the system after the heating step.

The piezoelectric thin film formed through use of the above-mentioned coating liquid may be doped with a slight amount of an element other than Pb, Zr, and Ti. Specific examples thereof include La, Ca, Sr, Ba, Sn, Th, Y, Sm, Ce, Bi, Sb, Nb, Ta, W, Mo, Cr, Co, Ni, Fe, Cu, Si, Ge, Sc, Mg, and Mn. The content thereof is 0.05 or less in terms of atomic fraction of all the metal atoms in lead zirconate titanate represented by the general formula $Pb_x(Zr_{(y)}Ti_{(1-y)})O_3$, where $x=1.0$ to $1.2$ and $0.4<y<0.6$.

[Method of Producing Coating Liquid for Forming Piezoelectric Thin Film]

First, a raw material compound of each component metal of the piezoelectric thin film is dispersed or dissolved in an appropriate organic solvent. A liquid in which the raw material compound is dispersed or dissolved in the organic solvent is hereinafter referred to as "raw material mixed solution". The organic solvent is appropriately selected from various known solvents in consideration of the dispersibility or solubility of the raw material compound, a temperature condition in the heating step described later, and a coating property when the organic solvent is contained in the coating liquid.

Examples of the organic solvent to be used include: alcohol-based solvents, such as methanol, ethanol, n-propanol, isopropanol, n-butanol, s-butanol, and t-butanol; ether-based solvents, such as tetrahydrofuran and 1,4-dioxane; cellosolve-based solvents, such as 2-methoxyethanol, 2-ethoxyethanol, and 1-methoxy-2-propanol; polyalcohol-based solvents, such as diethylene glycol monoethyl ether, diethylene glycol monoethyl ether acetate, diethylene glycol monobutyl ether, and diethylene glycol monobutyl ether acetate; amide-based solvents, such as N,N-dimethylformamide, N,N-dimethylacetamide, and N-methylpyrrolidone-based solvents; and nitrile-based solvents, such as acetonitrile. Of those, alcohol-based solvents are preferred. Those organic solvents may be used alone or in combination thereof. The amount of the organic solvent to be used in the raw material mixed solution in the present invention is generally from 5-fold mol to 200-fold mol, preferably from 10-fold mol to 100-fold mol with respect to the raw material compound.

The raw material for each component metal is described.

As the raw material compound, an alkoxide compound of the above-mentioned component metal and a salt of the above-mentioned component metal may be used. In particular, an alkoxide compound and an organic metal salt are preferred.

(Pb Raw Material)

Examples of the alkoxide compound of Pb include lead 2-ethoxyethoxide, lead methoxide, lead ethoxide, lead n-propoxide, lead i-propoxide, lead n-butoxide, lead i-butoxide, lead t-butoxide, and other various alkoxides and alkyl substitutes thereof.

In addition, examples of the metal salt of Pb include: inorganic salt compounds, specifically, for example, an oxide, a chloride, and a nitrate; and organic salt compounds, specifically various carboxylates, such as a formate, an acetate, and a propionate; hydroxycarboxylates; and acetylacetonato complexes. Those metal salts may each be used by being mixed with an alcohol-based solvent or the like to synthesize an alkoxide in situ.

Similar alkoxide compounds or metal salts may be used also for Zr, Ti, and other metals (such as La, Mg, and Nb).

The raw material compound may be a complex raw material compound containing any two kinds of Pb, Ti, and Zr and other component metals as necessary, in particular, a complex organic metal compound, instead of the above-mentioned compound containing one kind of metal. As an example of such complex organic metal compound, there are given $Pb[Ti(OC_3H_7)_6]$ and $Pb[Zr(OC_4H_9)_6]$. In the present invention, the organic metal compound is used in a broad sense including a metal and an organic group, and is not used in a narrow sense including a carbon-metal bond.

From the viewpoint of uniformly mixing the raw material compounds, it is preferred that an organic metal compound capable of being dissolved in the organic solvent to be used be used as each raw material compound. Further, when the raw material compound contains crystal water, it is preferred that the raw material compound be used after being previously heated at a temperature less than a decomposition temperature to be dehydrated. The reason for this is as follows. When the raw material compound is complexed in the subsequent heating step, a part of the raw material compound is hydrolyzed during complexing due to the presence of water containing crystal water, to thereby cause a variation of a precursor composition.

The loading ratio of each raw material compound may be a ratio that satisfies an intended PZT film composition: $Pb_x(Zr(y)Ti(1-y))O_3$, where $x=1.0$ to $1.2$ and $0.4<y<0.6$. However, Pb is eliminated in a sintering step during film formation, and hence it is preferred that the amount of a Pb raw material compound be previously increased at a time of preparation of a coating liquid. Specifically, the amount of the Pb raw material compound may be increased within a range of from 5% to 30% as a metal molar ratio.

Next, the raw material mixed solution is stabilized by adding a stabilizer thereto. The stabilizer causes a metal-oxygen-metal bond to proceed gradually as a whole during complexing through heating.

In the present invention, to the raw material mixed solution, as the stabilizer, there may be preferably added at least one kind selected from the group consisting of 1,8-diazabicyclo[5.4.0]-7-undecene, 1,5-diazabicyclo[4.3.0]non-5-ene, and 1,4-diazabicyclo[2.2.2]octane. The content of the stabilizer in the raw material compound solution may be appropriately selected within a range in which the improvement effect of the addition of the stabilizer is sufficiently obtained, and the stabilizer does not influence a film formation property of an obtained coating liquid. For example, the content of the stabilizer is preferably a concentration of 0.005-fold mol or more and 5.0-fold mol or less, particularly preferably a concentration of 0.05-fold mol or more and 2.5-fold mol or less with respect to the molar number of all the metal atoms. 1,8-Diazabicyclo[5.4.0]-7-undecene, 1,5-diazabicyclo[4.3.0]non-5-ene, and 1,4-diazabicyclo[2.2.2]octane may be used alone or in combination thereof. Further, the stabilizer may be used in the form of a salt bonded to an acid. Specifically, there are known, for example, a formate and an octylate. In addition, as another stabilizer, conventionally used stabilizers, such as β-diketones (such as acetylacetone, heptafluorobutanoylpivaloylmethane, dipivaloylmethane, trifluoroacetylacetone, and benzoylacetone), ketonic acids (such as acetoacetic acid, propionylacetic acid, and benzoylacetic acid), lower alkyl esters, such as ethyl, propyl, and butyl esters, of those ketonic acids, oxyacids (such as lactic acid, glycolic acid, α-oxybutyric acid, and salicylic acid), lower alkyl esters of those oxyacids, oxyketones (such as diacetone alcohol and acetoin), α-aminoacids (such as glycine and alanine), and alkanolamines (such as diethanolamine, triethanolamine, and monoethanolamine) may be used in combination with the above-mentioned stabilizer. When another stabilizer is used in combination, the total addition amount of the stabilizers is preferably from 0.05-fold mol to 5-fold mol, more preferably from 0.1-fold mol to 1.5-fold mol with respect to the molar number of all the metal atoms. The addition amount of the conventional stabilizer to be used in combination in this case is, for example, generally from 0.01-fold mol to 20-fold mol, preferably from 0.05-fold mol to 10-fold mol with respect to one kind of 1,8-diazabicyclo[5.4.0]-7-undecene, 1,5-diazabicyclo[4.3.0]non-5-ene, and 1,4-diazabicyclo[2.2.2]octane.

The raw material mixed solution having the stabilizer added thereto is subjected to the heating step to provide a complex metal compound containing at least three kinds of metal elements of Pb, Ti, and Zr. The heating step is performed within a range of 120° C. or more and less than the boiling point of the organic solvent to be used. In particular, in the present invention, it is preferred that the raw material mixed solution be heated at a temperature of from 120° C. to 130° C. Therefore, the organic solvent to be used is set to contain at least one kind of organic solvent having a boiling point of 130° C. or more, preferably 150° C. or more. When the organic solvent to be used contains an organic solvent having a boiling point of 120° C. or less, the organic solvent may be refluxed by mounting a cooling pipe or the like on a reaction vessel. Through the heating step, the metal compounds react with each other or are coordinated to be complexed. When the heating step is performed at a temperature lower than 120° C., the reaction or coordination does not proceed sufficiently. Therefore, in the subsequent hydrolyzing step, a metal compound species that is easily hydrolyzed first starts being hydrolyzed, resulting in a coating liquid in which polycondensation is non-uniform. The orientation degree of a piezoelectric thin film formed from the coating liquid is low.

There is no particular limitation on the time period of the heating step, but it is preferred that the time period be 24 hours or more because complexing is performed at a relatively low temperature.

After the heating step, water is added to the system to perform hydrolysis. The amount of the water to be added for hydrolysis is, for example, preferably from 0.05-fold mol to 30-fold mol, more preferably from 0.5-fold mol to 15-fold mol of the raw material compound. Further, a water-soluble organic solvent, for example, an alcohol-based solvent may be added together with the water. The hydrolysis may be performed in the presence of an acid catalyst and/or a base catalyst. As the acid catalyst, a metal salt, a halide, a mineral acid such as sulfuric acid, nitric acid, or hydrochloric acid, or an organic acid such as acetic acid is preferably used. Further, as the base catalyst, ammonia, which can be easily removed by drying and sintering, is used in most cases.

The hydrolysis may also be performed at room temperature (25° C.), but is preferably performed by heating in order to shorten the reaction time. The hydrolysis may be performed at a temperature of, for example, 60° C. or more. Further, the hydrolysis may be performed at normal pressure or under increased pressure.

The reaction rate in this case may be controlled by the kind of a metal alkoxide and/or a metal salt, the kind of a solvent, the concentration of water with respect to the metal alkoxide and/or the metal salt, the concentration of the metal alkoxide and/or the metal salt, stabilization through chelation of the catalyst, the metal alkoxide and/or the metal salt, and the like.

After the hydrolysis, a liquid containing the water, the liquid having a boiling point of 100° C. or less, is completely removed, and a solvent having a boiling point of more than 100° C. is added to the resultant, to thereby adjust the concentration thereof to a precursor concentration suitable for coating. It is preferred that the precursor concentration in the coating liquid be set to a range of 10 mass % or more and 30 mass % or less as a concentration converted into a metal oxide. Examples of the solvent having a boiling point of more than 100° C. to be used include: cellosolve-based solvents, such as 1-methoxy-2-propanol, 2-ethoxyethanol, and 3-methoxy-3-methylbutanol; polyalcohol-based solvents, such as diethylene glycol monoethyl ether, diethylene glycol monoethyl ether acetate, diethylene glycol monobutyl ether, and diethylene glycol monobutyl ether acetate; and flavoring oils, such as terpineol, pine oil, and lavender oil. Of those, cellosolve-based solvents are preferred. In addition, the following compounds may also be used for the purpose of enhancing the coating property: cellulose derivatives, such as ethyl cellulose and hydroxypropyl cellulose; polymer resins, such as polyvinyl alcohol, polyvinylpyrrolidone, and polyvinylpyrrolidone derivatives; rosins and rosin derivatives; and the like.

After that, a predetermined amount of the stabilizer is further added to the resultant, with the result that the hydrolysis rate, the polycondensation rate, and the like of the raw material mixed solution can be suppressed, and the temporal stability can be improved without impairing the effects of enhancing the coating property and surface form.

The coating liquid is applied onto a lower electrode formed on a substrate and dried. As a coating method, a known coating method, such as spin coating, dip coating, bar coating, or spray coating, may be used. After the coating, the coating liquid on the substrate is heated so as to be dried. The drying after the coating is performed at a temperature of 100° C. or more and 400° C. or less. A temperature of 100° C. or less is not practical because it takes a long time period to dry the coating liquid.

There is no particular limitation on a thickness per layer after the drying, but the thickness is preferably from 0.01 μm to 5 μm. Further, the coating liquid may be applied again onto the film after the drying and dried to provide a laminated structure.

Then, calcining is performed within a range of from 600° C. to 700° C. For the calcining, a dryer, a hot plate, a tubular furnace, an electric furnace, or the like may be used. Further, the coating liquid may be applied again onto the film after the calcining and dried to provide a laminated structure. It is preferred that the total thickness be from about 1 μm to about 30 μm.

Further, sintering is performed within a range of from 600° C. to 800° C.

There is no particular limitation on a thickness after the sintering per layer formed of the coating liquid, but the thickness is selected within a range of from 0.01 μm to 1 μm, preferably from 0.02 μm to 0.9 μm in consideration of the workability. A piezoelectric thin film having an arbitrary film thickness can be obtained by repeating this operation. The drying step needs to be performed for each layer, but the calcining and the sintering may be performed for each layer or collectively at intervals of several layers. Further, the sintering may be performed only finally.

The gas present on the surface of the substrate from the drying step to the sintering is preferably an oxygen-containing atmosphere, and the concentration of oxygen is preferably from 20% to 100%. It is not preferred that the concentration of oxygen be less than 20% because sintering does not proceed, and a perovskite structure is not obtained, with the result that desired performance is not exhibited.

Further, the temperature may be increased in stages during sintering. An organic component is substantially eliminated through such sintering, and a piezoelectric thin film having a dense structure formed of a sintered product of the coating liquid for forming a piezoelectric thin film is obtained.

Figure 1:
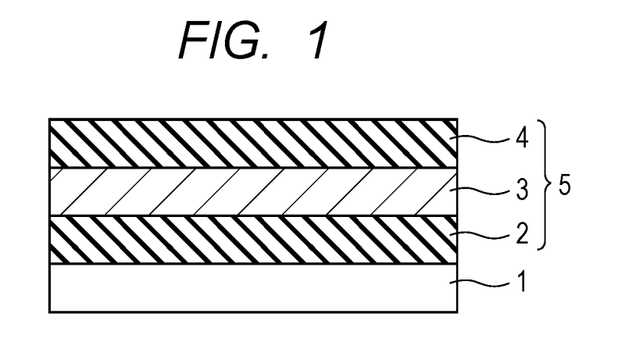
FIG. 1 is a sectional view for schematically illustrating a piezoelectric element including a piezoelectric thin film according to the present invention.

FIG. 1 is a schematic vertical sectional view for illustrating a piezoelectric element 5 as an example of the embodiment of the piezoelectric thin film obtained by the present invention. In FIG. 1, there are illustrated a substrate 1 configured to support the piezoelectric element 5, a lower electrode 2, a piezoelectric thin film 3, and an upper electrode 4.

There is no particular limitation on the material for the substrate 1, but it is preferred that the substrate 1 be made of a material which is not deformed or melted in the sintering step performed generally at 800° C. or less during formation of the piezoelectric thin film. Further, when a liquid ejection head configured to eject a liquid such as ink is manufactured through use of the piezoelectric element obtained by the present invention, the substrate 1 may also serve as a pressure chamber substrate configured to form a pressure chamber or as a vibrating plate. For this purpose, for example, a semiconductor substrate made of silicon (Si) or tungsten (W), or a heat-resistant stainless-steel (SUS) substrate is preferably used. Further, ceramics such as zirconia, alumina, or silica may be used. A plurality of kinds of those materials may be combined or laminated to be used as a multi-layer configuration.

The lower electrode 2 and the upper electrode 4 are each formed of a conductive layer having a thickness of from about 5 nm to about 2,000 nm. There is no particular limitation on the material for the conductive layer, and it is only necessary that the material be a material which is generally used in a piezoelectric element. For example, there may be given metals, such as Ti, Pt, Ta, Ir, Sr, In, Sn, Au, Al, Fe, Cr, and Ni, and oxides thereof. The electrodes may each be formed of one kind of those materials or a lamination of two or more kinds thereof.

Those metals and oxides may be formed on the substrate by being applied onto the substrate and sintered by the sol-gel method or may be formed by sputtering or vapor deposition. Alternatively, those metals and oxides may be used by being patterned into a desired shape.

The piezoelectric thin film 3 is a piezoelectric thin film of a perovskite crystal represented by a general formula: Pbx (Zr(y)Ti(1-y))O$_3$, where x=1.0 to 1.2 and 0.4<y<0.6, obtained by the present invention. A perovskite crystal having high piezoelectricity is obtained by setting the compositions of Zr and Ti within the above-mentioned range.

Figure 2:
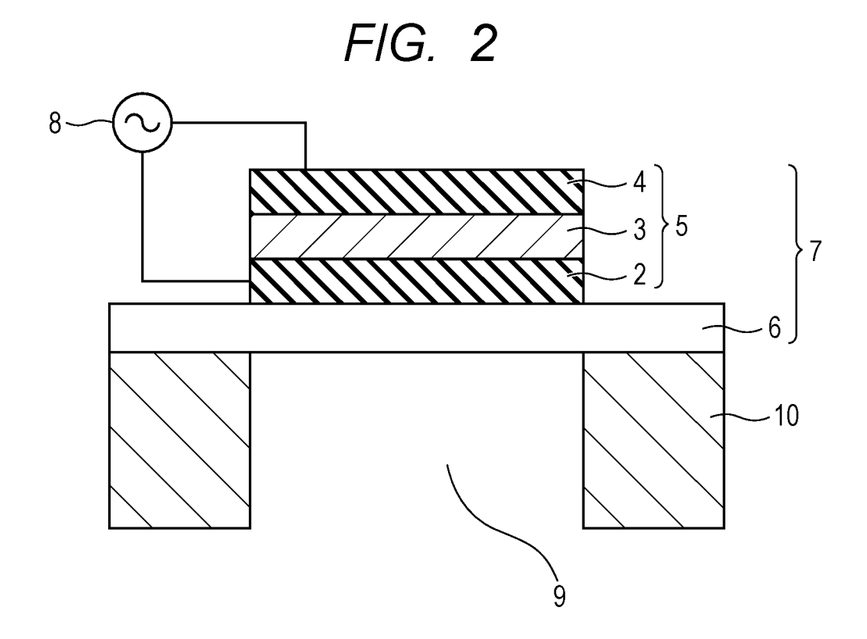
FIG. 2 is a sectional view for schematically illustrating a liquid ejection head including an actuator that includes the piezoelectric thin film according to the present invention.

FIG. 2 is a view for illustrating an example of the embodiment of the present invention and schematically illustrating, in an enlarged state, a part of a liquid ejection head in which the piezoelectric element is used as an actuator. The liquid ejection head of the present invention may be applied to apparatus, such as a printer, a copying machine, a facsimile apparatus including a communication system, a word processor including a printer portion, and further an industrial recording apparatus combined with various processing devices in a complexed manner. The liquid ejection head may also be applied to, for example, manufacturing of a biochip, electronic circuit printing, and manufacturing of a semiconductor substrate. The basic configuration of the liquid ejection head is the same as that of the related art, and an actuator 7 includes the piezoelectric element 5 and a vibrating plate 6. That is, the actuator 7 includes the vibrating plate 6 that includes a first surface facing a pressure chamber 9, the lower electrode 2 on a second surface of the vibrating plate 6, which is opposed to the first surface of the vibrating plate 6, the piezoelectric thin film 3 on the lower electrode 2, and the upper electrode 4 on the piezoelectric thin film 3. An ejection orifice forming member 10 includes a large number of ink ejection orifices (not shown) configured to eject ink, a large number of ink flow passages (not shown) that individually communicate with the ink ejection orifices, and a large number of pressure chambers 9 that individually communicate with the ink flow passages. The vibrating plate 6 is mounted so as to cover the entire surface opposed to the ejection orifices of the ejection orifice forming member 10, and the vibrating plate 6 closes upper surface openings of all the pressure chambers 9 of the ejection orifice forming member 10. The piezoelectric element 5 configured to give vibration drive force to the vibrating plate 6 is formed so as to adhere to the vibrating plate 6 at a position corresponding to each of the pressure chambers 9. A large number of piezoelectric elements 5 are displaced by controlling a power source 8 to apply a voltage to the desired selected piezoelectric element 5, and thus the vibrating plate 6 in that portion is vibrated. With this, the pressure chamber 9 in the portion corresponding to the vibration of the vibrating plate 6 changes in capacity, and ink is ejected from the ink ejection orifices through the ink flow passages, to thereby perform printing.

Next, a method of evaluating the piezoelectric thin film of the present invention is described. The (100) orientation state of the piezoelectric thin film can be easily confirmed based on the detection angle and reflection intensity of a diffraction peak in measurement by an X-ray diffraction method based on a 2θ/θ method using a Cu Kα line for a wavelength, which is generally used for a crystal thin film. For example, in a diffraction chart obtained from the piezoelectric thin film of the present invention, a (100) plane has peak intensity in the vicinity of 22°, a (110) plane has peak intensity in the vicinity of 31°, and a (111) plane has peak intensity in the vicinity of 38°. The ratio of the intensity of the (100) plane can be determined by dividing the peak intensity of the (100) plane by the total peak intensity of the (100) plane, the (110) plane, and the (111) plane.

The ratio of the reflection intensity of the (100) plane with respect to the total reflection intensity of the (100) plane, the (110) plane, and the (111) plane is preferably 90% or more, particularly preferably 95% or more both in an outer peripheral portion of the substrate and in a center portion thereof because satisfactory piezoelectricity is obtained.

Further, in the present invention, when a circular substrate is used, the center portion of the substrate refers to the range of from the center to ½ of the radius, and the outer peripheral portion refers to the range of from ½ or more of the radius to the outer peripheral portion. In the outer peripheral portion, a portion in which the piezoelectric thin film is not formed and a portion in which a film surface is disturbed due to, for example, coating unevenness or a crack are removed, if any.

EXAMPLES

The present invention is more specifically described below by way of Examples, but the present invention is not limited to the following Examples.

Example 1: Production Example of Coating Liquid 1

As a coating liquid (piezoelectric thin film precursor) for forming a piezoelectric thin film, a coating liquid having a metal composition represented by Pb/Zr/Ti=1.2/0.52/0.48 was prepared as follows.

1.2 mol of lead acetate trihydrate was dehydrated by heating, and the resultant was mixed and dissolved with 1.2 mol of 1.8-diazabicyclo[5.4.0]-7-undecene serving as a stabilizer and 1-methoxy-2-propanol (9.0 mol). Then, 0.52 mol of zirconium n-butoxide and 0.48 mol of titanium isopropoxide were added to the mixture, and the resultant was further stirred with heating at 120° C. for 24 hours to subject raw material metal compounds to a complexing reaction with each other, to thereby provide a complex organic metal compound. Next, water (5.0 mol) and ethanol (5.0 mol) were added to the complex organic metal compound to cause a hydrolysis reaction at 60° C. for 8 hours. In this case, acetic acid (3.8 mol) and acetylacetone (0.6 mol) were added to the resultant. Then, a solvent having a boiling point of 100° C. or less was completely removed with a rotary evaporator, and diethylene glycol monoethyl ether was added to the resultant to adjust the concentration so that a metal oxide concentration converted into the above-mentioned composition formula reached 23 mass %, to thereby prepare a coating liquid 1.

Example 2: Production Example of Coating Liquid 2

As a coating liquid (piezoelectric thin film precursor) for forming a piezoelectric thin film, a coating liquid having a metal composition represented by Pb/Zr/Ti=1.1/0.53/0.47 was prepared as follows.

1.1 mol of lead acetate trihydrate was dehydrated by heating, and the resultant was mixed and dissolved with 1.0 mol of 1.8-diazabicyclo[5.4.0]-7-undecene serving as a stabilizer and 1-methoxy-2-propanol (9.0 mol). Then, 0.53 mol of zirconium n-butoxide and 0.47 mol of titanium isopropoxide were added to the mixture, and the resultant was further stirred with heating at 125° C. for 20 hours to subject raw material metal compounds to a complexing reaction with each other, to thereby provide a complex organic metal compound. Next, water (5.0 mol) and ethanol (5.0 mol) were added to the complex organic metal compound to cause a hydrolysis reaction. In this case, acetic acid (3.8 mol) and acetylacetone (0.6 mol) were added to the resultant. Then, a solvent having a boiling point of 100° C. or less was completely removed with a rotary evaporator, and diethylene glycol monoethyl ether was added to the resultant to adjust the concentration so that a metal oxide concentration converted into the above-mentioned composition formula reached 20 mass %, to thereby prepare a coating liquid 2.

Example 3: Production Example of Coating Liquid 3

As a coating liquid (piezoelectric thin film precursor) for forming a piezoelectric thin film, a coating liquid having a metal composition represented by Pb/Zr/Ti=1.2/0.52/0.48 was prepared as follows.

1.2 mol of lead acetate trihydrate was dehydrated by heating, and the resultant was mixed and dissolved with 1.2 mol of 1.8-diazabicyclo[5.4.0]-7-undecene serving as a stabilizer and 1-methoxy-2-propanol (9.0 mol). Then, 0.52 mol of zirconium n-butoxide and 0.48 mol of titanium isopropoxide were added to the mixture, and the resultant was further stirred with heating at 128° C. for 20 hours to subject raw material metal compounds to a complexing reaction with each other, to thereby provide a complex organic metal compound. Next, water (5.0 mol) and ethanol (5.0 mol) were added to the complex organic metal compound to cause a hydrolysis reaction. In this case, acetic acid (3.8 mol) and acetylacetone (0.6 mol) were added to the resultant. Then, a solvent having a boiling point of 100° C. or less was completely removed with a rotary evaporator, and diethylene glycol monoethyl ether was added to the resultant to adjust the concentration so that a metal oxide concentration converted into the above-mentioned composition formula reached 23 mass %, to thereby prepare a coating liquid 3.

Comparative Example 1: Production Comparative Example of Coating Liquid C1

As a coating liquid (piezoelectric thin film precursor) for forming a piezoelectric thin film, a coating liquid having a metal composition represented by Pb/Zr/Ti=1.2/0.52/0.48 was prepared as follows.

1.2 mol of lead acetate trihydrate was dehydrated by heating, and the resultant was mixed and dissolved with 1.2 mol of 1.8-diazabicyclo[5.4.0]-7-undecene serving as a stabilizer and 1-methoxy-2-propanol (9.0 mol). Then, 0.52 mol of zirconium n-butoxide and 0.48 mol of titanium isopropoxide were added to the mixture, and the resultant was further stirred with heating at 117° C. for 24 hours to subject raw material metal compounds to a complexing reaction with each other, to thereby provide a complex organic metal compound. Next, water (5.0 mol) and ethanol (5.0 mol) were added to the complex organic metal compound to cause a hydrolysis reaction. In this case, acetic acid (3.8 mol) and acetylacetone (0.6 mol) were added to the resultant. Then, a solvent having a boiling point of 100° C. or less was completely removed with a rotary evaporator, and diethylene glycol monoethyl ether was added to the resultant to adjust the concentration so that a metal oxide concentration converted into the above-mentioned composition formula reached 23 mass %, to thereby prepare a coating liquid C1.

The particle size distribution (volume distribution, number distribution) of each coating liquid prepared in Examples 1, 2, and 3, and Comparative Example 1 was measured with a concentrated system particle size analyzer FPAR-1000 (trade name) manufactured by Otsuka Electronics Co., Ltd. The results are shown in Table 1. The peak position of the particle size distribution of each of Examples 1, 2, and 3 was 100 nm or less, whereas the peak position of the particle size distribution of Comparative Example 1 was more than 100 nm.

Figure 3:
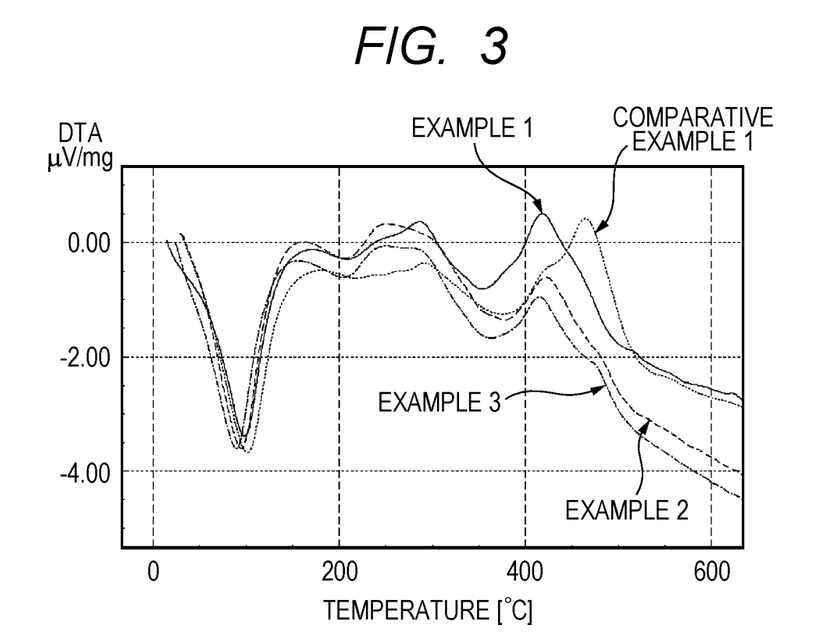
FIG. 3 is a graph for showing differential thermal analysis of coating liquids prepared in Examples 1 to 3 and Comparative Example 1.

FIG. 3 is a graph for showing differential thermal analysis of each coating liquid prepared in Examples 1, 2, and 3, and Comparative Example 1. The peak temperature on a highest temperature side of the differential thermal analysis read from FIG. 3 is shown in Table 1. The differential thermal analysis was performed by the following method.

Apparatus: Thermo gravimetry differential thermal analyzer DTG-60H (trade name) manufactured by Shimadzu Corporation Condition: Platinum cell, air flow velocity of 50 ml/min, temperature increase rate of 20° C./min, reference material alumina

TABLE 1

| | Heating temperature during precursor formation (° C.) | Peak position of particle size distribution (nm) | Peak temperature of differential thermal analysis (° C.) |
|---|---|---|---|
| Example 1 | 120 | 85 | 435 |
| Example 2 | 125 | 95 | 440 |
| Example 3 | 128 | 95 | 420 |
| Comparative Example 1 | 117 | 105 | 470 |

Example 4

A silicon oxide ($SiO_2$) layer was formed to have a thickness of 500 nm by thermal oxidation on the surface of a silicon substrate having a diameter of 6 inches (15 cm). Further, Ti and Pt were formed to have thicknesses of 50 nm and 200 nm, respectively on the silicon oxide layer by sputtering, to provide a substrate to be used in this Example.

As a coating step, the coating liquid 1 prepared in Example 1 was applied as a first layer onto the Pt surface of the substrate with a spin coater (15 seconds at 3,000 rpm). Then, as the step of removing an organic solvent contained in the coating liquid on the substrate out of the system, the coated substrate was placed on a hot plate heated to 280° C. for 5 minutes to evaporate the organic solvent in the coating liquid. The substrate having the organic solvent evaporated therefrom was subjected to calcining by being kept in an electric furnace heated to 650° C. for 10 minutes.

The coating liquid 1 was applied onto the substrate subjected to the calcining in the same manner as in the first layer, and the organic solvent was evaporated under the same condition as that of the first layer. Further, the resultant was subjected to calcining by being kept in the electric furnace heated to 650° C. for 10 minutes in the same manner as in the first layer.

Further, the step of applying the coating liquid onto the substrate, the step of removing the organic solvent contained in the coating liquid on the substrate out of the system, and the step of subjecting the substrate to calcining by keeping the substrate in the electric furnace heated to 650° C. for 10 minutes were repeated six times, to thereby form eight layers in total.

After the eight layers were formed, the step of keeping the substrate in an electric furnace at 700° C. for 20 minutes, to form the piezoelectric thin film precursor into a piezoelectric thin film was performed.

Examples 5 and 6, and Comparative Example 2

Piezoelectric thin films were manufactured in the same manner as in Example 4 with the exception that the coating liquids shown in Table 2 prepared in Examples 2 and 3, and Comparative Example 1 were used instead of the coating liquid 1 in Example 4.

Figure 4:
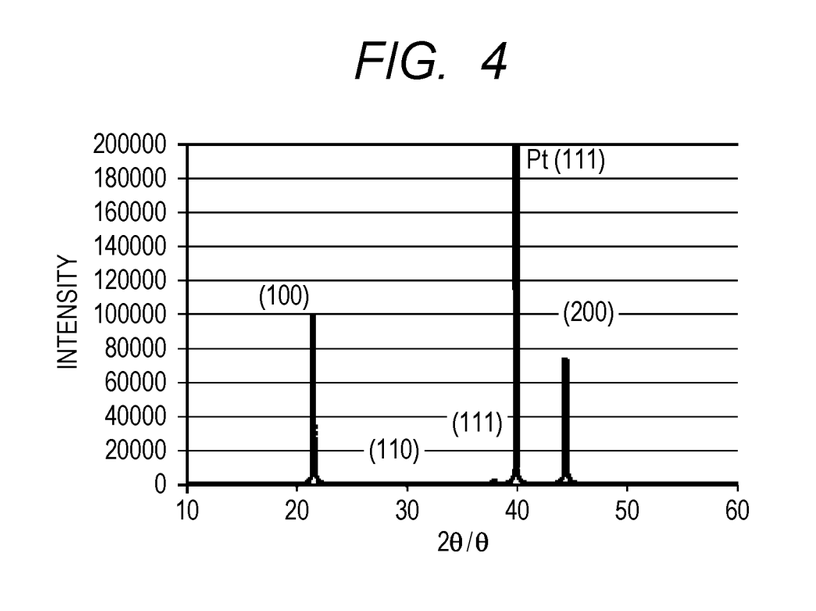
FIG. 4 is a graph for showing an X-ray diffraction pattern of a piezoelectric thin film manufactured in Example 4.

Each piezoelectric thin film on the substrate manufactured in Examples 4, 5, and 6, and Comparative Example 2 was evaluated as follows. X-ray diffraction (2θ/θ method) of the piezoelectric thin film in a center portion of the substrate was performed with an X-ray diffraction apparatus (RINT2100 (trade name); manufactured by Rigaku Corporation). An X-ray diffraction pattern of the piezoelectric thin film of Example 4 is shown in FIG. 4. A peak observed in the vicinity of 40° corresponds to a peak of a (111) plane of Pt arranged on the substrate. From FIG. 4, an intensity value of a (100) plane of the piezoelectric thin film was divided by the total intensity value of the (100) plane, a (110) plane, and the (111) plane to provide a ratio of the intensity of the (100) plane.

Each ratio of the intensity of the (100) plane in Examples 4, 5, and 6, and Comparative Example 2 is shown in Table 2. It is understood from Table 2 that the ratio of a (100) orientation is as high as 95% or more in each of the piezoelectric thin films of Examples 4 to 6. It is also understood that the ratio of the (100) orientation is low in the piezoelectric thin film of Comparative Example 2.

TABLE 2

|  | Coating liquid | Ratio of (100) orientation (%) |
| --- | --- | --- |
| Example 4 | 1 | 97.7 |
| Example 5 | 2 | 96.0 |
| Example 6 | 3 | 96.5 |
| Comparative Example 2 | C1 | 76.2 |

It is understood from Table 1 that, when the temperature for subjecting the raw material metal compounds of the coating liquid to a complexing reaction with each other to provide the complex organic metal compound is set to 120° C. or more, the peak position of the particle size distribution of the coating liquid reaches 100 nm or less, and the peak temperature on a highest temperature side of differential thermal analysis of the coating liquid reaches 450° C. or less. It is also understood that the piezoelectric thin film obtained from the coating liquid produced as described above is strongly and preferentially oriented in the (100) plane as shown in Table 2.

According to the present invention, the coating liquid for forming a piezoelectric thin film in which the ratio of the (100) orientation of PZT is extremely higher than those of the (111) orientation and the (110) orientation can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-099735, filed May 18, 2016, which is hereby incorporated by reference herein in its entirety.

What is claimed is:

1. A coating liquid for forming a piezoelectric thin film containing lead zirconate titanate, the coating liquid comprising a complex precursor containing Pb, Ti, and Zr, and at least one selected from the group consisting of 1,8-diazabicyclo[5.4.0]-7-undecene, 1,5-diazabicyclo[4.3.0]non-5-ene, and 1,4-diazabicyclo[2.2.2]octane,
    wherein an exothermic peak of the coating liquid is at a temperature of 400° C. to 450° C. in differential thermal analysis of the coating liquid.

2. The coating liquid according to claim 1, wherein the coating liquid has a peak position of particle size distribution of 100 nm or less.

3. The coating liquid according to claim 1, wherein the coating liquid is free from a liquid having a boiling point of 100° C. or less.

4. A method of producing a coating liquid for forming a piezoelectric thin film, comprising:
    heating at least three raw material compounds containing each of Pb, Ti, and Zr, or at least two raw material compounds including a complex raw material compound containing any two of Pb, Ti, and Zr and a raw material compound containing the remaining one of Pb Ti, and Zr, at a temperature of 120° C. or more in an organic solvent, to thereby form a complex metal compound containing Pb, Ti, and Zr; and
    hydrolyzing the complex metal compound by adding water to a system after the heating, to thereby form a complex precursor containing Pb, Ti, and Zr;
    wherein the heating is performed in the presence of at least one selected from the group consisting of 1,8-diazabicyclo[5.4.0]-7-undecene, 1,5-diazabicyclo[4.3.0]non-5-ene, and 1,4-diazabicyclo[2.2.2]octane, and
    wherein an exothermic peak of the coating liquid formed after the hydrolyzing is at a temperature of 400° C. to 450° C. in differential thermal analysis of the coating liquid.

5. The method according to claim 4, further comprising, after the hydrolyzing:
    removing a liquid containing the water, the liquid having a boiling point of 100° C. or less; and
    adding an organic solvent having a boiling point of more than 100° C. to the complex precursor, to thereby adjust a concentration of the complex precursor.

6. A method of manufacturing a piezoelectric thin film, comprising:
    applying a coating liquid for forming a piezoelectric thin film containing lead zirconate titanate onto a substrate, the coating liquid comprising a complex precursor containing Pb, Ti, and Zr, and at least one selected from the group consisting of 1,8-diazabicyclo[5.4.0]-7-undecene, 1,5-diazabicyclo[4.3.0]non-5-ene, and 1,4-diazabicyclo[2.2.2]octane; and forming the piezoelectric thin film containing lead zirconate titanate by a sol-gel method,
wherein an exothermic peak of the coating liquid is at a temperature of 400° C. to 450° C. in differential thermal analysis of the coating liquid.

* * * * *